United States Patent [19]

Legler

[11] 3,737,796

[45] June 5, 1973

[54] LINEARLY CONTROLLED AMPLIFIER

[75] Inventor: Ernst Legler, 6101 Seeheim, Germany

[73] Assignee: Robert Bosch Fernsehanlagen Gesellschaft mit beschrankter Haftung, Stuttgart, Germany

[22] Filed: Dec. 7, 1971

[21] Appl. No.: 205,668

[30] Foreign Application Priority Data

Dec. 8, 1970 Germany....................P 20 60 192.7

[52] U.S. Cl.....................................330/29, 330/30 D

[51] Int. Cl................................................H03g 3/30

[58] Field of Search........................330/20, 29, 30 D, 330/69; 325/319

[56] References Cited

UNITED STATES PATENTS

| | | | |
|---|---|---|---|
| 3,533,005 | 10/1970 | Alm | 330/29 |
| 3,210,683 | 10/1965 | Pay | 330/30 D UX |
| 3,512,096 | 5/1970 | Nagata et al | 330/30 D |

*Primary Examiner*—Roy Lake
*Assistant Examiner*—James B. Mullins
*Attorney*—Michael S. Striker

[57] ABSTRACT

A linearly controlled amplifier has delay-free amplification control. The amplifier has a first cascode amplification stage for amplifying an alternating current signal which has a non-linear gain control characteristic for amplifying the signal. A control voltage is supplied to the first amplification stage for controlling the gain of the latter. A second cascode amplification stage is connected to the control means for distorting the control signal applied to the first amplification stage. The second amplification stage comprises a DC amplifier and is provided with negative feedback for distorting the control voltage. The application of the thus predistorted control voltage to the first amplification stage results in a linear relationship between the control voltage and the gain of the first amplification stage. Each of the stages consist of the cascode amplifier has one input and two output transistors.

9 Claims, 3 Drawing Figures

Patented June 5, 1973 3,737,796 for controlling the gain of the amplifier is applied. This is usually a DC voltage, as to be described. The base electrode 13 of the transistor $T_3$ is connected to the ground potential of the circuit. A resistor 14 is connected between the positive supply voltage $+U_B$ and the collector of the transistor $T_3$. The output voltage is taken from the latter collector as shown. A resistor 15 is connected between the emitter of the input transistor $T_1$ and the negative supply voltage $-U_B$.

With the circuit as described thus far, the application of a DC control voltage $U'_{ST}$ to electrode 12 may change the gain of the amplifier stage 10 in so far as the alternating voltage signal is concerned. As well known, with circuits of this type, the biasing conditions are adjusted to result in a predetermined amount of current to flow through the input transistor $T_1$. The current flowing through the transistor $T_1$ is, however, a combination of the currents flowing through the output transistors $T_2$ and $T_3$. In fact, with the type of circuit arrangement shown, the current flowing through the transistor $T_1$ remains substantially constant irrespective of how the current division takes place between the two output transistors. Thus, the current flowing from the emitters of the output transistors $T_2$ and $T_3$ combine in the collector of the input transistor $T_1$ to produce the predetermined current. By applying a control voltage between the base electrodes 12 and 13, the relative current contributions of the transistors $T_2$ and $T_3$ can be changed at will. Since the base electrode 13 is connected to ground, the control voltage $U'_{ST}$ applied to the base terminal 12 applies a predetermined DC voltage to the latter relative to the ground potential, and therefore relative to the base electrode 13.

FIG. 2 shows the gain control characteristic of the circuit described thus far in FIG. 1. FIG. 2 illustrates the variations of the relative gain G/Gmax, namely the gain G relative to the maximum circuit gain Gmax, as a function of the applied DC control voltage $U'_{ST}$. As can be noted, the gain variation is substantially linear over less than 50 percent of the total range of gain control.

In order to linearize the circuit, again referring to FIG. 1, a feedback resistor 14, according to known methods, is connected between the collector of the controlled transistor $T_2$ and its base terminal 12. As described in the Background of the Invention, the presence of signal voltages at the collector of $T_2$ results in an alternating signal being fed back via feedback resistor 14 to the controlled base terminal 12. To minimize the modulation effect described above, coupling or filter circuits were utilized in the prior art. Particularly low-pass filters were utilized which had low cut-off frequencies to insure that the signal voltages were attenuated substantially while passing to the control input terminal 12 through the feedback path. As shown in FIG. 1, such filter circuits typically consist of capacitors 16 and 17 and resistors 18 and 19. These components serve to decouple the output from the control terminal. However, as described above, to be effective, these require large capacities and result in time delayed control. The application of the control voltage $U_{ST}$ to the resistor 18 results in a time delayed effective control voltage $U'_{ST}$, since the resistor 18 and the capacitor 17 comprise an integrating circuit having associated therewith a time constant.

Referring now to FIG. 3, a linearly gain controlled amplifier 20 having delay-free amplification control is shown. The same reference designations are utilized for designating corresponding similar components shown in FIG. 1. Thus, it is noted that the amplifier 20 consists of two cascode amplifying circuit which are each very similar to the single stage shown in FIG. 1. The first amplifying circuit consists of the input transistor $T_1$ and two output transistors $T_2$ and $T_3$. As in the above-described circuit, the base electrode of the input transistor $T_1$ constitutes a principal input utilized for the application of the input alternating voltage signal to be amplified from an A.C. signal source $U_e$. Also, the base electrode 13 of the output transistor $T_3$ is connected to the circuit ground potential. However, now the collector of the output transistor $T_3$ is connected directly to the positive voltage supply $+U_B$, while the collector of the output transistor $T_2$ is connected to the load resistance (not shown) via the lead 21.

The first cascode amplifying circuit operates as a signal amplifier which amplifies the input signals applied to the base electrode 11 of the input transistor $T_1$, as to be described. Connected to the first cascode amplifying circuit is a second or dummy cascode amplifying circuit which consists of input transistor $T_1'$ and output transistors $T_2'$ and $T_3'$. The corresponding transistors in the two stages are selected to have similar electrical characteristics so that similar DC operating conditions can be established for the two stages. The collector of the output transistor $T_2'$ is connected to the corresponding collector of the output transistor $T_2$. A resistor 22 is connected between the latter collectors and the positive supply voltage $+U_B$. The base 13' of the output transistor $T_2'$ is connected to the ground circuit potential, similarly to the base 13 of the output transistor $T_3$. A resistor 23 is connected between the positive supply voltage $+U_B$ and the collector of the output transistor $T_3'$. The resistor 24, serving the same function as the resistor 15, is connected between the emitter of the input transistor $T_1'$ and the negative supply voltage $-U_B$. The base electrode 25 of the input transistor $T_1'$ is connected to a source of DC voltage $U_{DC}$. The DC voltage applied to the latter base is adjusted to equalize the average current flowing through the input transistors $T_1$ and $T_1'$.

While the first cascode amplifying circuit constitutes an alternating voltage amplification stage, the second or dummy cascode circuit is employed only as a direct current amplification stage whose functions are to be described.

The two control inputs, i.e., base electrodes 12 and 12' of the corresponding output transistors $T_2$ and $T_3'$ are connected to each other as shown. A source of control voltage $U_{ST}$ is applied to the circuit through the lead 26. A decoupling resistor 27 is inserted between the control voltage source and the respective bases. Another decoupling resistor 28, also serving as negative feedback means, is connected between the collector of the output transistor $T_3'$ and the connected bases of the output transistors as shown. The junction point where the connected bases as well as the resistors 27 and 28 meet is designated by the reference numeral 29. The effective control voltage applied to the bases 12 and 12' is designated by $U'_{ST}$.

The operation of the above-described circuit is as follows:

The direct current operating points of both the cascode stages are adjusted so that the average current flowing through the input transistors $T_1$ and $T_1'$ are sub-

LINEARLY CONTROLLED AMPLIFIER

BACKGROUND OF THE INVENTION

The present invention relates to linearly controlled amplifiers, and particularly amplifiers having delay-free amplification gain control.

Amplifiers having linear gain control are already known. A well-known method of linearizing the gain of an amplifier as a function of a DC control voltage is to utilize negative feedback, where part of the output of the amplifier is fed back to the input. However, this approach has sometimes resulted in problems, particularly in certain applications such as video mixing circuits. Thus, the output point where the feedback voltage is taken usually includes the alternating voltage signal which has been amplified. Consequently, alternating signal is fed back to the DC control input. This has the disadvantage that the control signal, now a fluctuating voltage, modulates the input signal.

To alleviate this problem, it has been known to utilize de-coupling and filtering networks for preventing the feeding back of the alternating signals to the DC control voltage input. This, however, has not always been successful since total elimination of the signal voltages in the feedback path is difficult. The latter approach has had the additional disadvantage that filtering circuits generally are associated with the use of capacitors, these being used in most filter networks. The addition of the capacitors both at the amplifier output as well as at the control voltage input has resulted in time delays in the operation of the circuit. However, and particularly in connection with video mixers in the television art, such time delays or circuit time constants are not desirable.

It has been known, for example, to control the gain of a cascode amplifier, having one input and two output transistors in the manner described above. In this case, the control voltage is applied between the two bases of the output transistors while the input signal to be amplified is supplied to the base of the one input transistor. The resulting gain control characteristic of such a circuit, however, has shown substantial non-linearity. Attempts at improving the control characteristic in the manner described above, has resulted in the undesirable time delays which are associated with filter circuits used to decouple the control input terminal from the amplifier output when a feedback path is utilized.

In many other areas of automatic and control technology, linear gain controlled amplifiers find numerous uses. However, as described above, many of these uses further require instantaneous gain control.

SUMMARY OF THE INVENTION

Accordingly, it is an object of the present invention to provide a linearly controlled amplifier which does not have the disadvantages of the prior art.

It is another advantage of the present invention to provide a linearly controlled amplifier which is simple in construction and does not have a time delay in the control characteristic.

It is still another object of the present invention to provide a linearly controlled amplifier wherein the signal to be amplified is not modulated by a feedback voltage and which does not have a time delay in the control characteristic.

It is a further object of the present invention to provide a linearly controlled amplifier which utilizes two cascode amplifier stages, one of which is utilized to amplify the alternating voltage signal, while the other amplifier is a DC amplifier which is used to predistort the control voltage applied to the first amplifier for linearizing the gain of the first amplifier.

According to the present invention, a linearly controlled amplifier has a delay-free amplification control and comprises first cascode amplification means for amplifying a signal. The first cascode amplification means has a non-linear gain control characteristic. Control means are provided for supplying a control signal to said first amplification means for controlling the gain of the latter. Second cascode amplification means are provided which are connected to said control means for distorting said control signal applied to said first amplification means. In this manner, a linear relationship results between said first signal and the gain of said first amplification means.

According to a presently preferred embodiment, each of the application means comprises two output transistors and one input transistor. The bases of two of the output transistors of the respective stages are connected to one another, while the other bases of each respective stage is connected to the circuit ground. A control voltage is applied to the connected bases while the input signal to be amplified is applied to the base of the input transistor of the first cascode stage. The second cascode stage consists of a DC amplifier and a feedback resistor is connected from one of the collectors of the output transistors of the second stage to the connected bases. The input transistor base of the second stage is biased so that both stages have similar operating points. The collector of the controlled transistor of the first stage and the grounded transistor of the second stage are connected, this connection forming the output point for the amplifier.

The novel features which are considered as characteristic for the invention are set forth in particular in the appended claims. The invention itself, however, both as to its construction and its method of operation, together with additional objects and advantages thereof, will be best understood from the following description of the specific embodiments when read in connection with the accompanying drawings.

DESCRIPTION OF THE PREFERRED EMBODIMENT

Figures 1, 2:
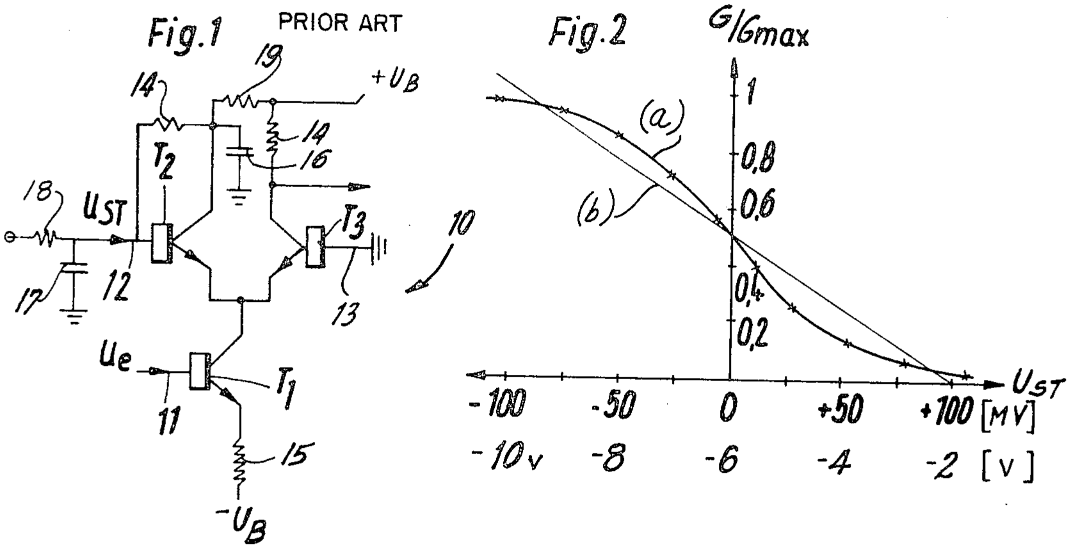
FIG. 1 is a schematic of a cascode amplifier stage, showing the prior art approach for linearizing the gain control characteristic.
FIG. 2 represents graphs showing the gain control characteristics of both the cascode amplifier stage shown in FIG. 1 as well as the gain control characteristic of an amplifier according to the present invention, shown in FIG. 3.

Referring first to FIG. 1, a prior art cascode amplifier stage 10 consists of one input transistor $T_1$ and two output transistors $T_2$ and $T_3$. The input transistor $T_1$ has an input base electrode 11 to which the input signal to be amplified is applied. The output transistor $T_2$ has a base electrode 12 to which the control signal $U'_{ST}$ to be used stantially equal. This generally involves adjusting the voltage U applied to the base electrode 25 of the input transistor $T_1'$ to correspond with the voltages prevailing at the base terminal 11 of the input transistor $T_1$.

Initially, when a control voltage $U_{ST}$ is applied to the lead 26, the gain of the first amplification cascode stage tends to change in accordance with the control curve (a) in FIG. 2, in a manner described in reference with the circuit shown in FIG. 1. However, with the present arrangement, the same control voltage $U_{ST}$ is applied to the base electrode of the output transistor $T_3'$. The application of a control voltage to the output transistor $T_3'$ in such manner modifies the current flowing in the collector of said transistor. The current flowing through the collector of the output transistor $T_3'$ comprises at least a portion of the current flowing through the resistor 23, the voltage at the collector of the output transistor $T_3'$ changing with the variations in the current flowing through the resistor 23. These voltage variations at this collector, are reflected via the feedback resistor 28 to the junction point 29. These negative feedback reflected voltages combine with the control voltage $U'_{ST}$ at the junction point 29 to result in a predistorted effective voltage which is applied to the bases 12 and 12' of the corresponding output transistors $T_2$ and $T_3'$. The use of the negative feedback to result in such predistorted voltage, which is applied to the output transistor $T_2$ for amplification of the desired signal, results in the desired linear gain control. This is accomplished by first obtaining a linear relationship between the current flowing in the output transistors of the direct current cascode stage and the control voltage $U_{ST}$. This is accomplished by the use of the negative feedback via the resistor 28. The resulting predistorted voltage at the junction point 29, when applied to the base of the output transistor $T_2$, results in a characteristic curve (b) as shown in FIG. 2. It will be noted that the latter curve is linear over the entire gain control range, although the applied control voltages have changed in magnitude. Thus, the upper scale for the control voltage, in millivolts, applies to the control voltage $U'_{ST}$ of the circuit shown in FIG. 1, while the lower scale applies to the control voltage $U_{ST}$, in volts, applied in the circuit shown in FIG. 1 and 3.

Figure 3:
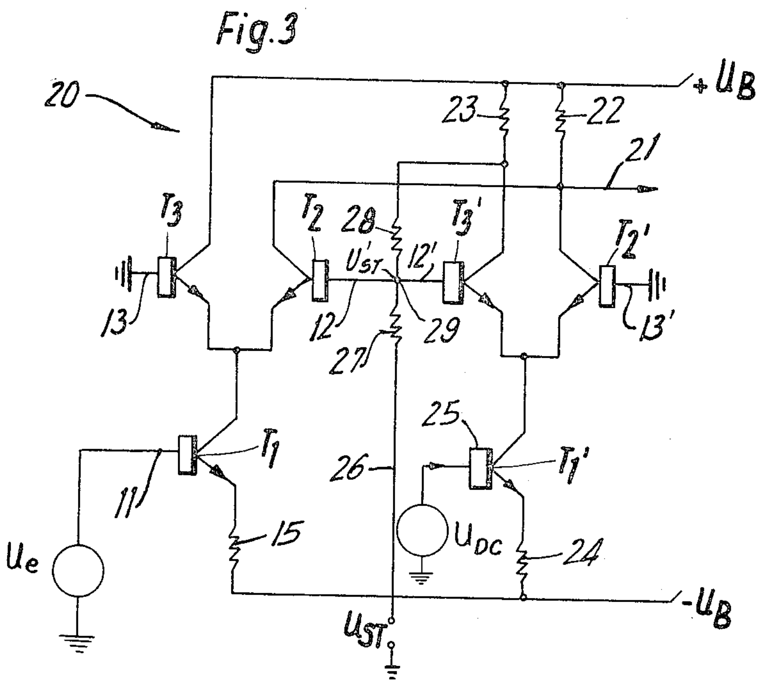
FIG. 3 is a schematic of two cascode amplifier stages connected in accordance with the present invention and having a linear gain control characteristic as shown in FIG. 2.

With the circuit shown in FIG. 3, modulation or filtering problems do not exist. Thus, the input alternating signal is applied to the base electrode 11 of the input transistor $T_1$ and it is amplified in the first amplifier cascode stage. Now, the amplified signal output is taken from the collector of the output transistor $T_2$ which is connected to the collector of the output transistor $T_2'$. However, because the output transistor $T_2'$ is not effectively controlled by the application of an alternating voltage signal to its collector, it remains functioning purely as a DC control element. This is true because the internal resistance between the collector and the emitter of a transistor in such an arrangement is very high. Consequently, the collector of the output transistor $T_3'$ is likewise devoid of any alternating current signals. Therefore, by this arrangement, the feedback voltage is taken from a point where the voltage is a function of the control voltage, but where only DC voltages appear. For this reason, the feedback voltage does not contain the alternating signal components found in the prior art and no additional filtering need be provided.

The circuit shown in FIG. 3 has the additional advantage that the output DC voltage level is maintained at the same operating point irrespective of the applied control voltage. As described above, the average currents flowing through the input transistors $T_1$ and $T_1'$ remains substantially constant during operation. Consequently, when the control voltage $U_{ST}$ is increased, for example, this has the effect of forcing each of the output transistors $T_2$ and $T_3'$ to conduct more direct current. As a result, the collector current of the output transistor $T_2$ increases. However, since the collector currents of the output transistor $T_3'$ also increases, for reasons described above, the collector current of the output transistor $T_2'$ decreases. Thus, by changing in opposite senses in response to changes in the control voltage, the total current flowing through resistor 22 is maintained substantially constant and consequently the DC operating voltage at the output lead 21 is also maintained substantially constant.

Based on the above description, it becomes clear that the second cascode stage does not provide any amplification for the signal to be amplified but serves to predistort the control signal applied to the first cascode stage which linearizes the latter. An additional advantage is the maintenance of the DC level over most of the anticipated control voltage range. This feature of maintaining the operation point constant is particularly important in cascaded stages. Thus, if the lead 21 in FIG. 3 is connected to a following stage (not shown), the constant DC level at the lead 21 makes it possible to directly couple the successive stages without additional compensation. In such coupled stages, a change in the output operating point which is restored by the application of a quick regulation voltage may result in a disturbing DC impulse which can be coupled to and have an adverse effect upon the following stage.

Although the invention has been illustrated and described in terms of cascade stages having three transistors each, the present invention can equally be used with transistor amplifier stages having greater than two transistors.

It will be understood that each of the elements described above, or two or more together, may also find a useful application in other types of linearly controlled amplifier circuits differing from the types described above.

While the invention has been illustrated and described as embodied in linearly controlled amplifier having delay-free amplification control, comprising two cascade stages each having three transistors, it is not intended to be limited to the details shown, since various modifications and structural changes may be made without departing in any way from the spirit of the present invention.

Without further analysis, the foregoing will so fully reveal the gist of the present invention that others can by applying current knowledge readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be protected by Letters Patent is set forth in the appended claims:

1. An amplifier having gain control, comprising in combination a first amplifying circuit and a dummy amplifying circuit, the two amplifying circuits having the same general circuit configuration, and each having a principal input for a signal to be amplified, a control input for a gain-control signal and an output, and each of said circuits being capable of producing at its output an amplified signal with a gain dependent upon the magnitude of a gain-control signal applied to its control input; means for transmitting a gain-control signal to the control inputs of both of said circuits; and negative feedback means connected between the output of said dummy circuit and said control inputs and operative for linearizing the dependence of the gain of said first circuit upon the magnitude of said gain-control signal by applying to the control input of said first circuit a negative feedback signal dependent upon the output of said dummy circuit.

2. An amplifier as defined in claim 1, wherein each of said amplifying circuits is a cascode transistor circuit.

3. An amplifier as defined in claim 2, wherein each of said amplifying circuits includes one input transistor and two output transistors, the collector of said input transistor being connected to the emitters of said output transistors, with the base of said input transistor constituting said principal input and the base of one of said output transistors constituting said control input.

4. An amplifier as defined in claim 1, wherein said negative feedback means is furthermore operative for making the D.C. level at the output of said dummy circuit linearly dependent upon the magnitude of said gain-control signal.

5. An amplifier as defined in claim 3, wherein said negative feedback means is furthermore operative for making the magnitudes of D.C. collector currents of said output transistors of said dummy circuit linearly dependent upon the magnitude of said gain-control signal.

6. An amplifier as defined in claim 1, wherein said dummy circuit has an additional complementary output, and wherein said output of said first circuit is connected to said complementary output of said dummy circuit.

7. An amplifier as defined in claim 3, wherein the transistors of said two circuits are so biassed that the D.C. collector currents of both input transistors are equal.

8. An amplifier as defined in claim 3, wherein that transistor of said dummy circuit whose base constitutes the control input thereof furthermore has a collector constituting the output of said dummy circuit, and wherein said control inputs are connected to each other, and wherein said means for transmitting a gain-control signal includes a decoupling resistance having one end connected to said control inputs and having another end available for receipt of said gain-control signal, and wherein said negative feedback means includes a feedback resistor having one end connected to said control inputs and another end connected to said output of said dummy circuit.

9. An amplifier having gain control, comprising in combination a first amplifying circuit and a dummy amplifying circuit, the two amplifying circuits having the same general circuit configuration, and each having a principal input for a signal to be amplified, a control input for a gain control signal and an output, and each of said circuits being capable of producing at its output an amplified signal with a gain dependent upon the magnitude of a gain-control signal applied to its control input; means for transmitting a gain-control signal to the control inputs of both of said circuits; means for applying to the principal input of said first circuit an A.C. input signal to be amplified; means for applying to the principal input of said dummy circuit only a steady-value D.C. signal, so that the signal at the output of said dummy circuit will have substantially no A.C. component; and negative feedback means connected between the output of said dummy circuit and said control inputs and operative for linearizing the dependence of the gain of said first circuit upon the magnitude of said gain-control signal by applying to the control input of said first circuit a negative feedback signal dependent upon the output level of said dummy circuit.

* * * * *